(12) United States Patent
Nakamura

(10) Patent No.: US 7,622,366 B2
(45) Date of Patent: Nov. 24, 2009

(54) METHOD OF MANUFACTURING SEMICONDUCTOR DEVICE

(75) Inventor: Masaru Nakamura, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/248,441

(22) Filed: Oct. 9, 2008

(65) Prior Publication Data
US 2009/0124063 A1 May 14, 2009

(30) Foreign Application Priority Data
Nov. 13, 2007 (JP) .............................. 2007-294653

(51) Int. Cl.
*H01L 21/00* (2006.01)
(52) U.S. Cl. ........................ 438/463; 438/460; 438/461; 438/462; 438/464; 257/E21.499
(58) Field of Classification Search ......... 438/460–464; 257/E21.499
See application file for complete search history.

(56) References Cited

U.S. PATENT DOCUMENTS 6,939,785 B2 * 9/2005 Kajiyama et al. ........... 438/463

2006/0197260 A1 * 9/2006 Yoshikawa et al. .......... 264/482

FOREIGN PATENT DOCUMENTS

| JP | A 2000-182995 | 6/2000 |
|----|---------------|--------|
| JP | A 2002-118081 | 4/2002 |

* cited by examiner

*Primary Examiner*—Charles D Garber
*Assistant Examiner*—Yasser A Abdelaziez
(74) *Attorney, Agent, or Firm*—Greer, Burns & Crain, Ltd.

(57) ABSTRACT

A method of manufacturing a semiconductor device by which a wafer with devices formed in a plurality of regions demarcated by a plurality of streets formed in a grid pattern in the face-side surface of the wafer is divided along the streets into individual devices, and an adhesive film for die bonding is attached to the back-side surface of each of the devices. The adhesive film is attached to the back-side surface of the wafer divided into individual devices by exposing cut grooves formed along the streets by a dicing-before-grinding method, and thereafter the adhesive film is irradiated with a laser beam along the cut grooves through the cut grooves from the side of a protective tape adhered to the face-side surface of the wafer, so as to fusion-cut the adhesive film along the cut grooves.

1 Claim, 13 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device by which a wafer with devices formed in a plurality of regions demarcated by streets formed in a grid pattern in the face-side surface of the wafer is divided along the streets into individual devices, and an adhesive film for die bonding is attached to the back-side surface of each of the devices.

2. Description of the Related Art

For example, in the semiconductor device manufacturing process, devices such as ICs and LSIs are formed in a plurality of regions demarcated by planned dividing lines (streets) formed in a grid pattern in the face-side surface of a roughly circular disk-shaped semiconductor wafer, and the regions provided therein with the devices are divided along the streets, thereby manufacturing the individual semiconductor devices. As a dividing apparatus for dividing the semiconductor wafer, a dicing apparatus is generally used, to cut the semiconductor wafer along the streets by a cutting blade having a thickness of about 20 µm. The semiconductor devices divided in this manner are packaged, to be widely used for electric apparatuses such as mobile phones and personal computers.

To the back-side surface of each of the semiconductor devices divided individually, an adhesive film for die bonding called a die attach film formed from a polyimide resin, an epoxy resin, an acrylic resin or the like and having a thickness of 20 to 40 µm is attached, and the semiconductor devices are attached to a die bonding frame for supporting the semiconductor devices through the adhesive film, by heating. As a method of attaching the adhesive film for die bonding to the back-side surface of each of the semiconductor device, a method is used in which the adhesive film is adhered to the back-side surface of a semiconductor wafer, the semiconductor wafer is adhered to a dicing tape through the adhesive film, and thereafter the semiconductor wafer is cut together with the adhesive film by a cutting blade along streets formed in the face-side surface of the semiconductor wafer, thereby forming the semiconductor devices with the adhesive film attached to the back-side surface thereof (refer to, for example, Japanese Patent Laid-open No. 2000-182995).

According to the method disclosed in Japanese Patent Laid-open No. 2000-182995, however, there is a problem in that at the time of cutting the semiconductor wafer together with the adhesive film by the cutting blade into individual semiconductor devices, chipping may occur at the back-side surfaces of the semiconductor devices or whisker-like burrs may be generated at the adhesive film, causing wire breakage at the time of wire bonding.

In recent years, more reductions in weight and size have been requested as to electric apparatuses such as mobile phones and personal computers, and thinner semiconductor devices have hence been demanded. As a technique for dividing semiconductor devices from each other more thinly, a dividing technique called the dicing-before-grinding method has been put to practical use. The dicing-before-grinding method is a technique in which cut grooves with a predetermined depth (a depth corresponding to a finished thickness of semiconductor devices) are formed along the streets from the face-side surface of the semiconductor wafer, and then the back-side surface of the semiconductor wafer provided with the cut grooves in the face-side surface thereof is ground so as to expose the cut groove on the back side and thereby to divide the semiconductor wafer into individual semiconductor devices. According to this method, the semiconductor devices can be machined to a thickness of 50 µm or below.

However, in the case of dividing a semiconductor wafer into individual semiconductor devices by the dicing-before-grinding method, the cut grooves with a predetermined depth are formed along the streets from the face-side surface of the semiconductor wafer and thereafter the back-side surface of the semiconductor wafer is ground to expose the cut grooves on the back side, so that it is impossible to preliminarily attach an adhesive film for die bonding to the back-side surface of the semiconductor wafer. Therefore, the operation of bonding the semiconductor device to a die bonding frame for supporting the semiconductor device by the dicing-before-grinding method has to be carried out while inserting a bonding agent between the semiconductor device and the die bonding frame, and, hence, the bonding operation cannot be carried out smoothly.

In order to solve such a problem, there has been proposed a method of manufacturing a semiconductor device in which an adhesive film for die bonding is attached to the back-side surface of a wafer divided into individual semiconductor devices by the dicing-before-grinding method and the semiconductor devices are adhered to a dicing tape through the adhesive film, and thereafter, those parts of the adhesive film which are exposed in gaps between the semiconductor devices are irradiated with a laser beam through the gaps from the face side of the semiconductor devices, whereby those parts of the adhesive film which are exposed in the gaps are removed (refer to, for example, Japanese Patent Laid-open No. 2002-118081).

However, when the adhesive film for die bonding which is attached to the back-side surface of the wafer divided into the individual semiconductor devices is irradiated with the laser beam through the gaps between the semiconductor devices to thereby fusion-cut the adhesive film, debris may be scattered to be deposited on the back-side surfaces of the devices, thereby lowering the quality of the semiconductor devices.

In addition, when the adhesive film for die bonding is adhered to the back-side surfaces of the semiconductor devices divided individually by the dicing-before-grinding method and thereafter the protective tape having been adhered to the face-side surface of the wafer is peeled off, the individually divided semiconductor devices are moved. As a result, the gaps composed of the cut grooves formed along the streets come to meander, making it difficult to irradiate the adhesive film with a laser beam through the gaps between the semiconductor devices.

SUMMARY OF THE INVENTION

Accordingly, it is an object of the present invention to provide a method of manufacturing a semiconductor device by which an adhesive film for die bonding can be attached to the back-side surface of each of individual devices divided by the dicing-before-grinding method, without lowering the quality of the devices.

In accordance with an aspect of the present invention, there is provided a method of manufacturing a semiconductor device, for manufacturing a plurality of semiconductor devices from a semiconductor wafer having devices formed respectively in a plurality of regions demarcated by a plurality of streets formed in a grid pattern in a face-side surface of the semiconductor wafer, the method including: a cut groove forming step of forming cut grooves having a depth corresponding to a finished thickness of the devices, from the face side of the wafer and along the streets; a protective tape adhering step of adhering a protective tape to the face-side surface of the wafer provided with the cut grooves; a wafer dividing step of grinding a back-side surface of the wafer with the protective tape adhered thereto so as to expose the cut grooves on the back side and dividing the wafer into individual devices; an adhesive film attaching step of adhering an adhesive film to the back-side surface of the wafer divided into the individual devices, and supporting the wafer with the adhesive film attached thereto by a dicing tape attached to an annular frame; an adhesive film fusion-cutting step of irradiating the adhesive film with a laser beam along the cut grooves through the cut grooves from the side of the protective tape adhered to the face-side surface of the wafer supported by the dicing tape, and fusion-cutting the adhesive film along the cut grooves; a protective tape peeling step of peeling off the protective tape adhered to the face-side surface of the wafer after performing the adhesive film fusion-cutting step; and a picking-up step of peeling from the dicing tape the devices to which the adhesive film fusion cut along the cut grooves by performing the adhesive film fusion-cutting step is attached, and picking up the devices.

According to the present invention, the protective film is in the state of being adhered to the face-side surface of the wafer, at the time of carrying out the adhesive film fusion-cutting step of fusion-cutting the adhesive film by irradiating the adhesive film with the laser beam through the cut grooves after the adhesive film is attached to the back-side surface of the wafer divided into the individual devices by exposing the cut grooves formed along the streets by performing the wafer dividing step. Therefore, even if debris is scattered at the time of fusion-cutting the adhesive film, the debris is deposited on the protective tape, so that the debris would not be deposited on the devices formed on the face side of the wafer. Besides, since the protective tape is in the state of being adhered to the face-side surface of the wafer at the time of carrying out the adhesive film fusion-cutting step, the individually divided devices would not be moved. Therefore, the gaps composed of the cut grooves formed along the streets would not come to meander, so that the irradiation with the laser beam can be carried out through the gaps between the devices.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
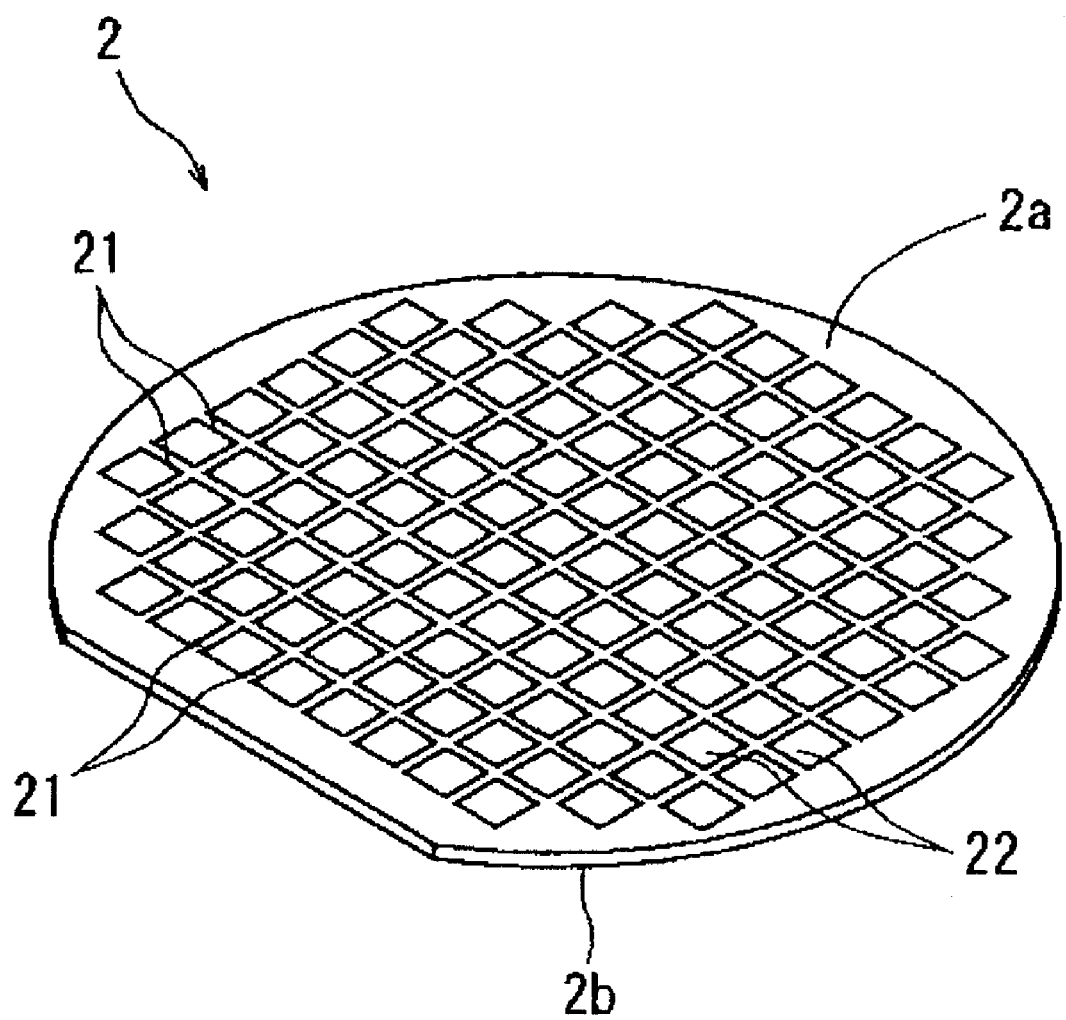
FIG. 1 is a perspective view of a semiconductor wafer as a wafer.

Now, a preferred embodiment of the method of manufacturing a semiconductor device according to the present invention will be described in detail below, referring to the attached drawings. In FIG. 1, there is shown a perspective view of a semiconductor wafer as a wafer. The semiconductor wafer 2 shown in FIG. 1 is composed, for example, of a silicon wafer having a thickness of 600 μm, which is provided in its face-side surface 2a with a plurality of streets 21 in a grid pattern. In the face-side surface 2a of the semiconductor wafer 2, devices 22 such as ICs and LSIs are formed in a plurality of regions demarcated by the plurality of streets 21 formed in a grid pattern. A procedure of dividing the semiconductor wafer 2 into individual semiconductor devices by a dicing-before-grinding method will now be described.

Figure 2A:
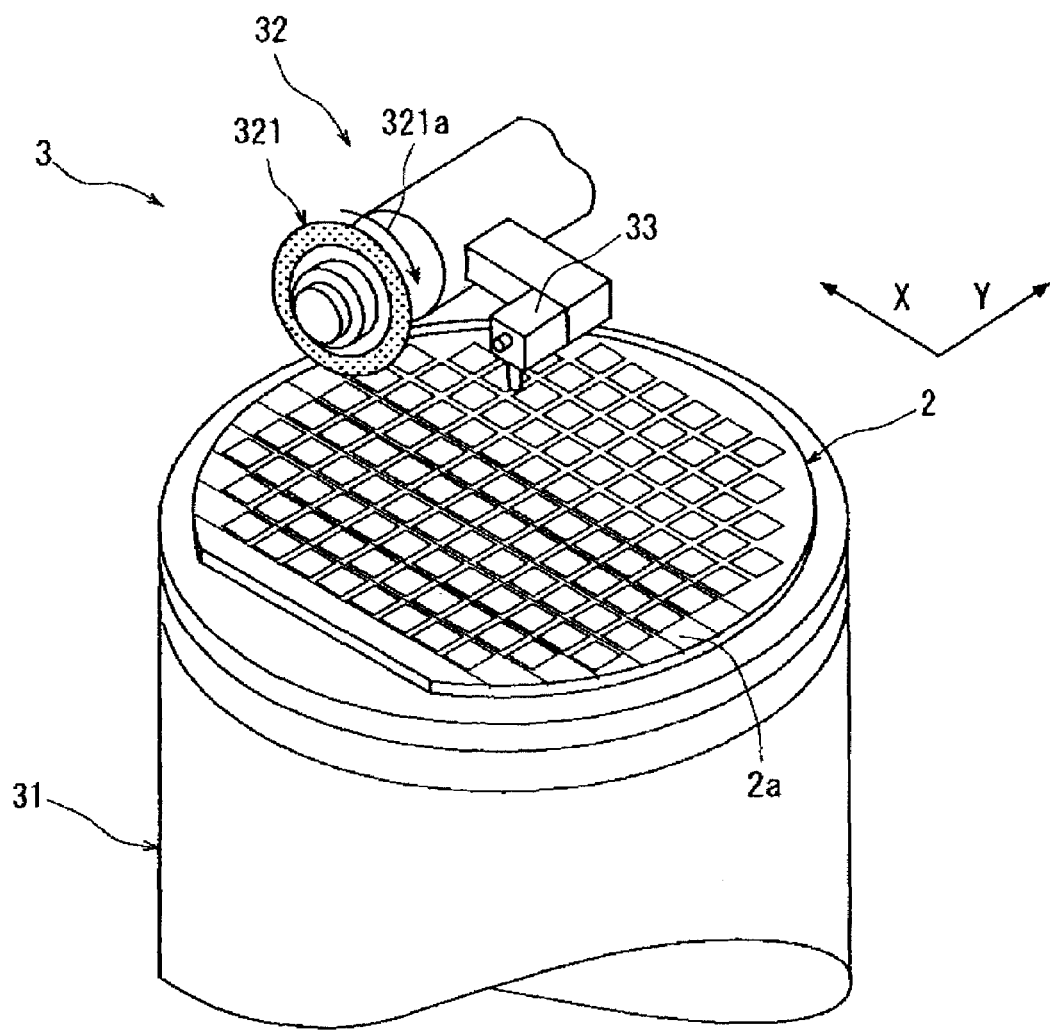
FIGS. 2A and 2B illustrate a dividing groove forming step in a wafer dividing step of a device manufacturing method based on the present invention.

In dividing the semiconductor wafer 2 into the individual semiconductor devices by the dicing-before-grinding method, first, cut grooves having a predetermined depth (a depth corresponding to a finished thickness of the devices) are formed along the streets 21 formed in the face-side surface 2a of the semiconductor wafer 2 (cut groove forming step). The cut groove forming step is carried out by use of a cutting apparatus 3 shown in FIG. 2A. The cutting apparatus 3 shown in FIG. 2A includes a chuck table 31 for holding a work, cutting means 32 having a cutting blade 321, and image pickup means 33. In carrying out the cut groove forming step by the cutting apparatus 3, the semiconductor wafer 2 is mounted on the chuck table 31, with its face-side surface 2a up. Then, suction means (not shown) is operated, whereby the semiconductor wafer 2 is held onto the chuck table 31. The chuck table 31 with the semiconductor wafer 2 suction held thereon in this manner is positioned into a position just under the image pickup means 33 by a cutting feeding mechanism (not shown).

After the chuck table 31 is positioned just under the image pickup means 33, an alignment work for detecting that cutting region of the semiconductor wafer 2 in which cut grooves are to be formed is conducted by use of the image pickup means 33 and control means (not shown). Specifically, the image pickup means 33 and the control means (not shown) perform an image processing such as pattern matching for positional matching between the street 21 formed in the semiconductor wafer 2 along a predetermined direction and the cutting blade 321 (alignment step). In addition, alignment of the cutting region is conducted in the same manner also with respect to a planned dividing line 21 formed in the semiconductor wafer 2 so as to extend perpendicularly to the predetermined direction.

Figure 2B:
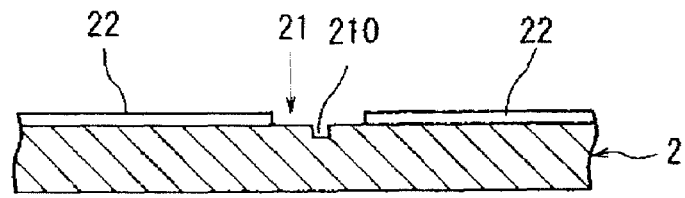

After the alignment of the cutting region of the semiconductor wafer 2 held on the chuck table 31 is thus carried out, the chuck table 31 with the semiconductor wafer 2 held thereon is moved to a cutting starting position of the cutting region. Then, the cutting blade 321 is moved downwards while being rotated in the direction of arrow 321a in FIG. 2A, whereby a cross feed by a predetermined amount is carried out. In this case, the cross feed position is so set that the outer circumferential edge of the cutting blade 321 is fed to a depth position (for example, 110 μm) corresponding to a finished thickness of the devices from the face-side surface of the semiconductor wafer 2. After the cross feed of the cutting blade 321 is thus carried out, the chuck table 31 with the cutting blade 321 in rotation is subjected to a cutting feed along the direction of arrow X in FIG. 2A, whereby a cut groove 210 in a depth (for example, 110 μm) corresponding to the finished thickness of the devices is formed along the street 21 as shown in FIG. 2B (cut groove forming step). The cut groove forming step is carried out along all the streets 21 formed in the semiconductor wafer 2.

Figure 3A:
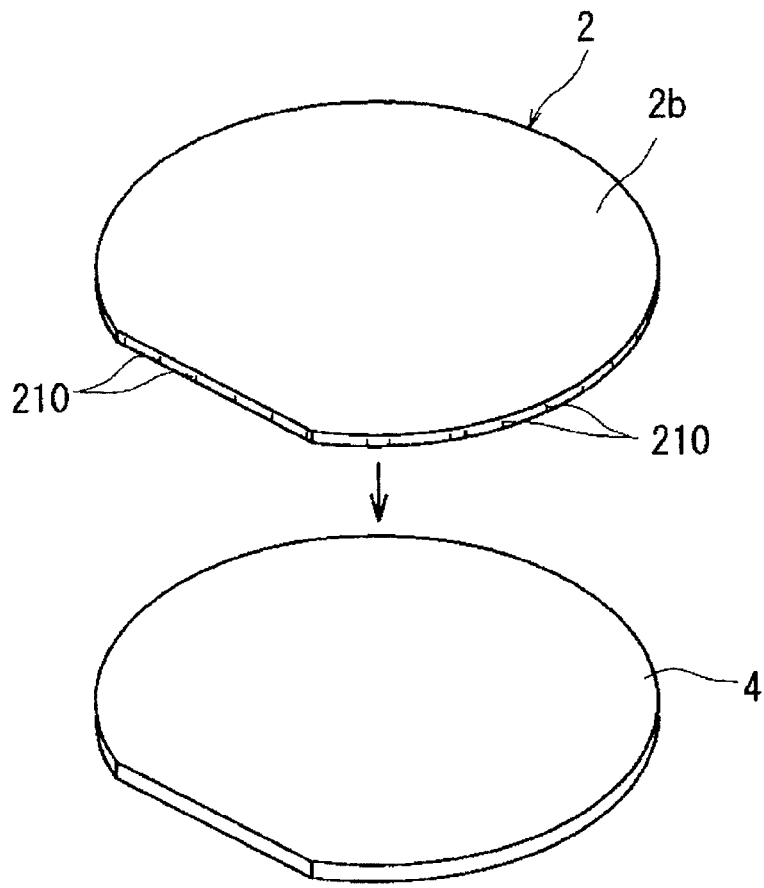
FIGS. 3A and 3B illustrate a protective member adhering step in the wafer dividing step of the device manufacturing method based on the present invention.
Figure 3B:
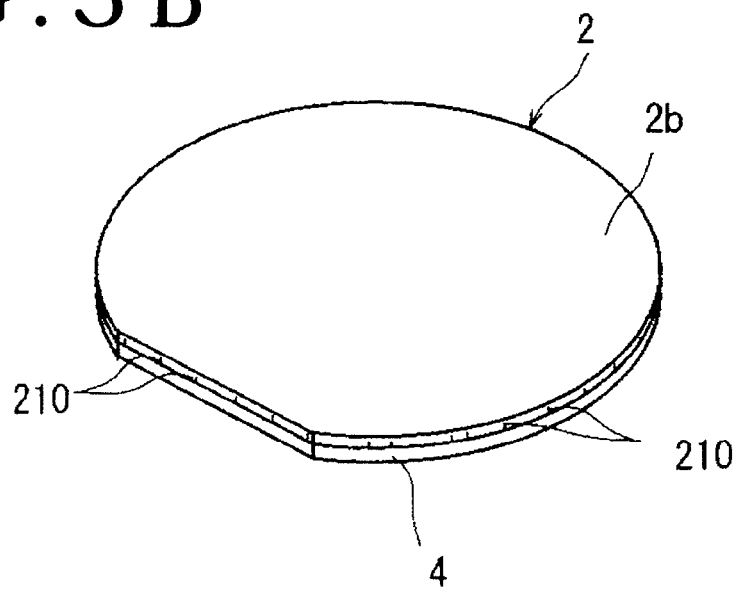

After the cut grooves 210 in the predetermined depth are formed along the streets 21 in the face-side surface 2a of the semiconductor wafer 2 by the above-mentioned cut groove forming step, a cutting protective tape 4 for protecting the devices 22 is adhered to the face-side surface 2a (the surface in which the devices 22 are formed) of the semiconductor wafer 2 as shown in FIGS. 3A and 3B (protective tape adhering step). Incidentally, in the embodiment shown in the figures, a polyolefin sheet having a thickness of 150 μm is used as the protective tape 4.

Figure 4A:
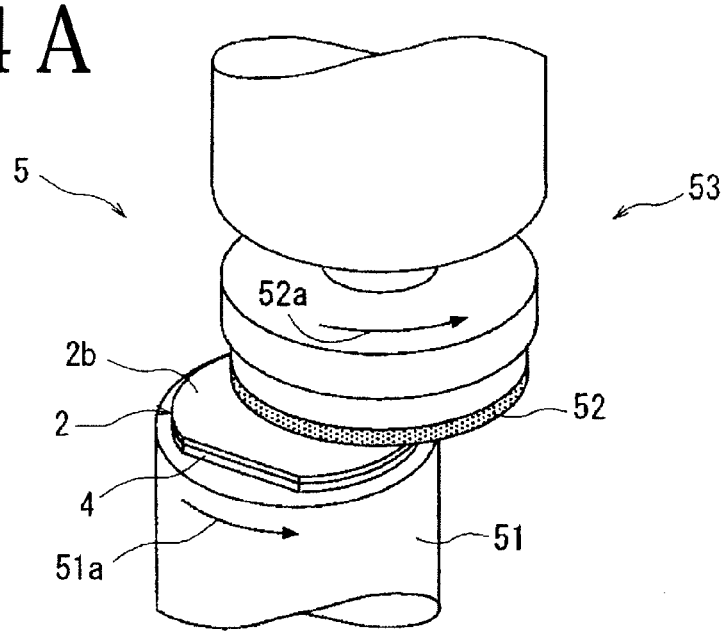
FIGS. 4A to 4C illustrate a dividing groove exposing step in the wafer dividing step of the device manufacturing method based on the present invention.
Figure 4B:
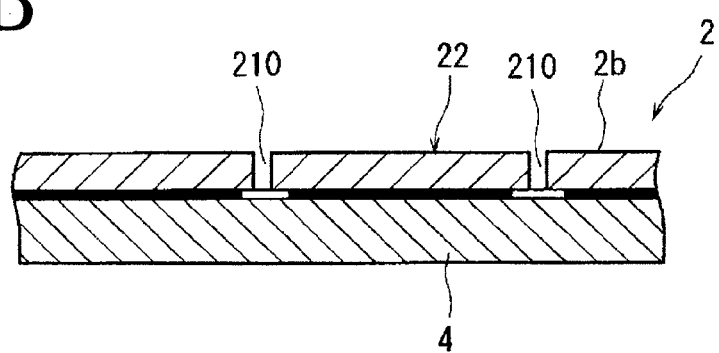
Figure 4C:
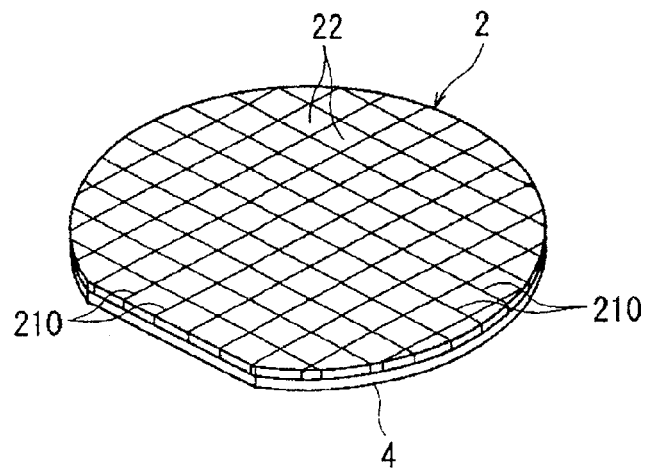

Next, a wafer cutting step is carried out in which a back-side surface 2b of the semiconductor wafer 2 with the protective tape 4 adhered to the surface thereof is ground so as to expose the cut grooves 210 in the back-side surface 2b, and the semiconductor wafer 2 is divided into individual devices. The wafer dividing step is carried out by use of a grinding apparatus 5 shown in FIG. 4A. The grinding apparatus 5 shown in FIG. 4A includes a chuck table 51 for holding a work, and grinding means 53 having a grinding stone 52. In carrying out the wafer dividing step by use of the grinding apparatus 5, the semiconductor wafer 2 is mounted on the chuck table 51, with its back-side surface 2b up. Then, suction means (not shown) is operated, whereby the semiconductor wafer 2 is suction held onto the chuck table 51. Subsequently, for example, while the chuck table 51 is kept in rotation at a rate of 300 rpm in the direction of arrow 51a, the grinding stone 52 of the grinding means 53 is rotated at a rate of 6000 rpm in the direction of arrow 52a and brought into contact with the back-side surface 2b of the semiconductor wafer 2, so as to grind the back-side surface 2b until the cut grooves 210 are exposed in the back-side surface 2b as shown in FIG. 4B. By thus grinding until the cut grooves 210 are exposed, the semiconductor wafer 2 is divided into the individual devices 22 as shown in FIG. 4C. Incidentally, since the protective tape 4 is left adhered to the surfaces of the plurality of devices 22 thus divided, the form of the semiconductor wafer 2 is maintained, without breaking up.

Figure 5A:
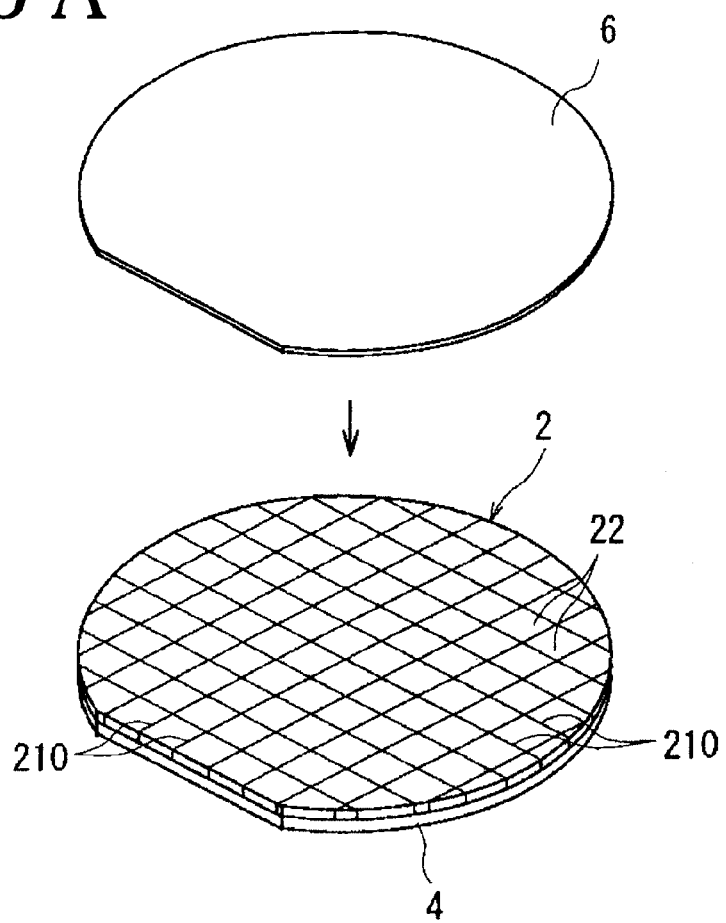
FIGS. 5A and 5B illustrate an adhesive film attaching step in the device manufacturing method based on the present invention.
Figure 5B:
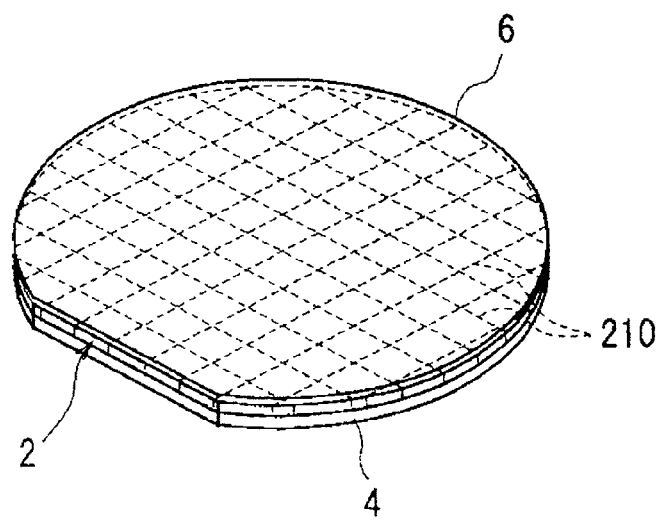

After the semiconductor wafer 2 is divided into the individual devices 22 by the above-mentioned dicing-before-grinding method, an adhesive film attaching step is carried out in which an adhesive film for die bonding is attached to the back-side surface 2b of the semiconductor wafer 2 divided into the individual devices 22. Specifically, the adhesive film 6 is attached to the back-side surface 2b of the semiconductor wafer 2 divided into the individual devices 22, as shown in FIGS. 5A and 5B. In this instance, the adhesive film 6 is adhered by pressing it against the back-side surface 2b of the semiconductor wafer 2 while heating it at a temperature of 80 to 200° C. Incidentally, the adhesive film 6 includes a film material of a mixture of an epoxy resin and an acrylic resin which has a thickness of 20 μm.

Figure 6A:
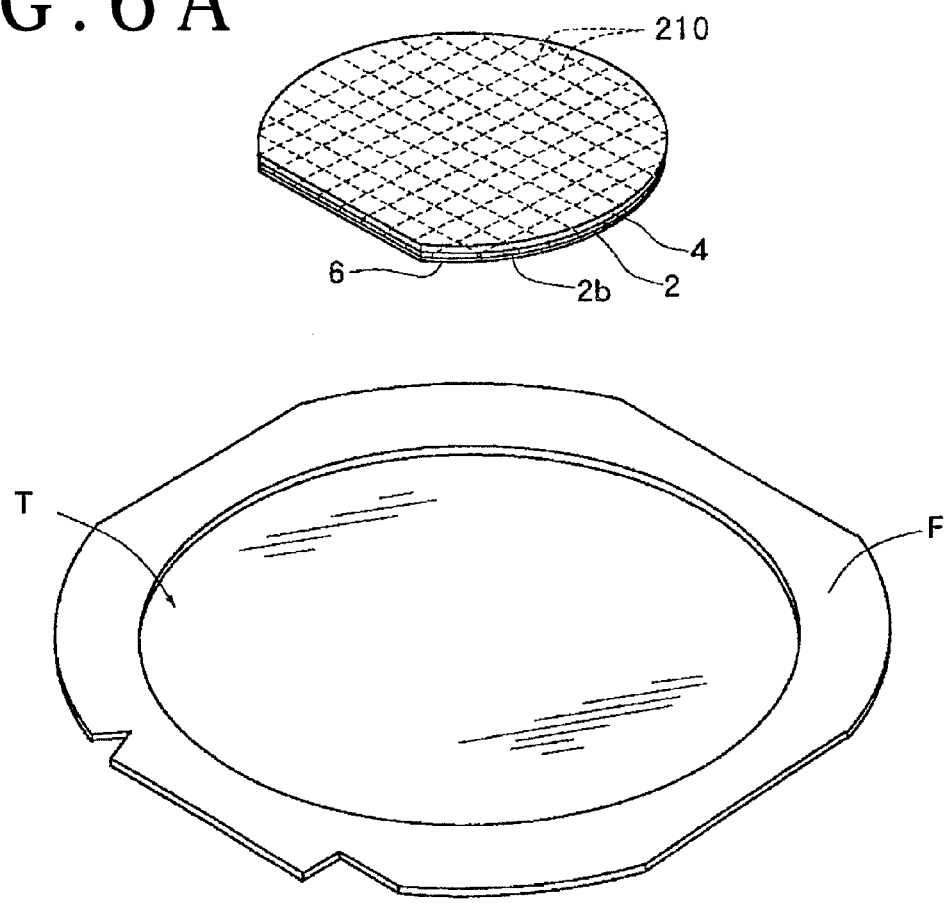
FIGS. 6A and 6B illustrate a wafer supporting step in the device manufacturing method based on the present invention.
Figure 6B:
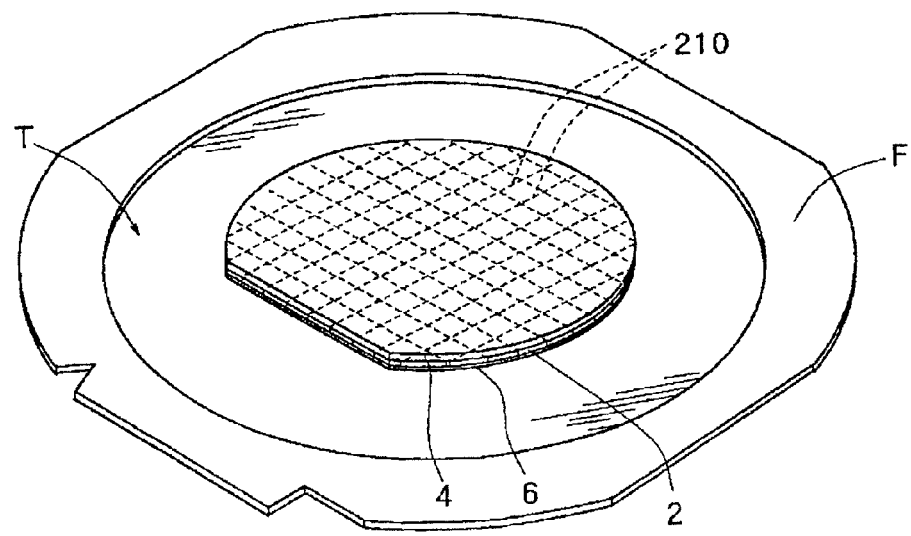

After the adhesive film attaching step is carried out as above-mentioned, a wafer supporting step is carried out in which the adhesive film 6 side of the semiconductor wafer 2 with the adhesive film 6 attached to thereto is adhered to an expandable dicing tape attached to an annular frame. Specifically, as shown in FIGS. 6A and 6B, the adhesive film 6 side of the semiconductor wafer 2 is adhered to the surface of the dicing tape T of which an outer peripheral part is attached to the annular frame F so as to cover an inside aperture part of the annular frame F. Therefore, the protective tape 4 adhered to the surface of the semiconductor wafer 2 is on the upper side. Incidentally, the dicing tape F, in the embodiment shown, is formed from a polyolefin sheet having a thickness of 95 μm. Incidentally, as the dicing tape F, a UV tape having such a property as to be lowered in tackiness in response to an external stimulus such as UV rays is used.

Figure 7A:
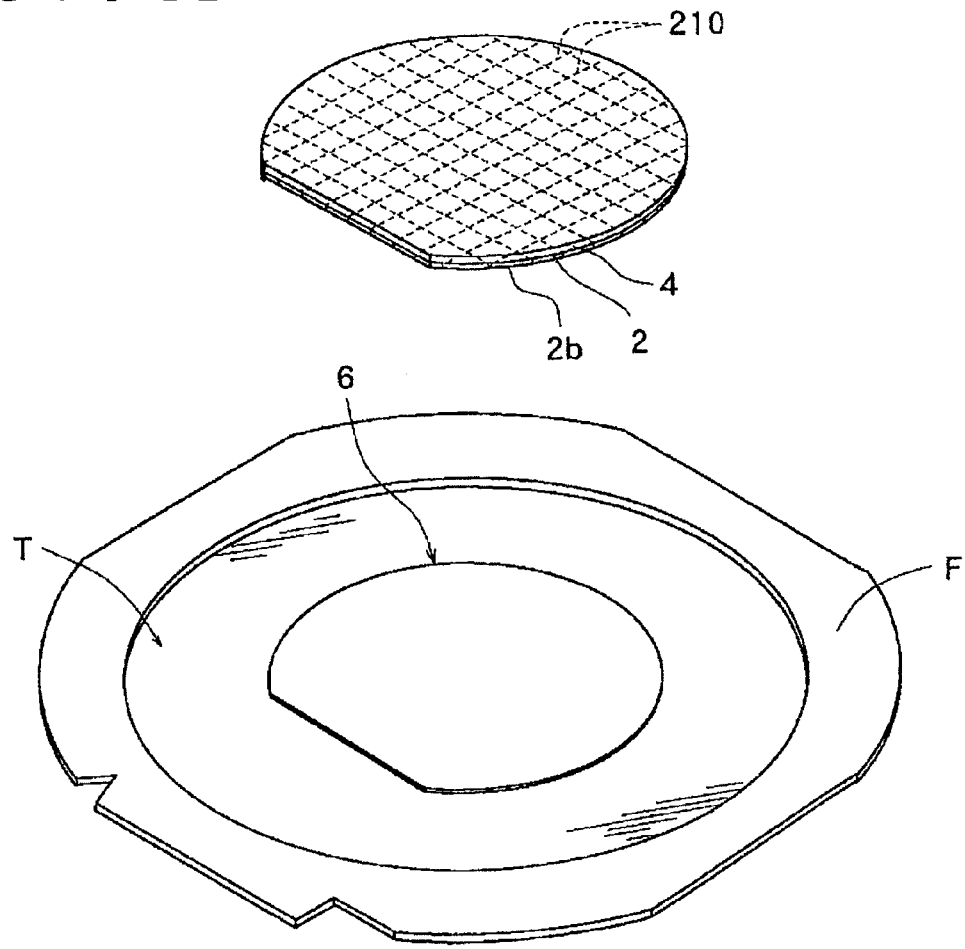
FIGS. 7A and 7B illustrate another embodiment of the adhesive film adhering step in the device manufacturing method based on the present invention.
Figure 7B:
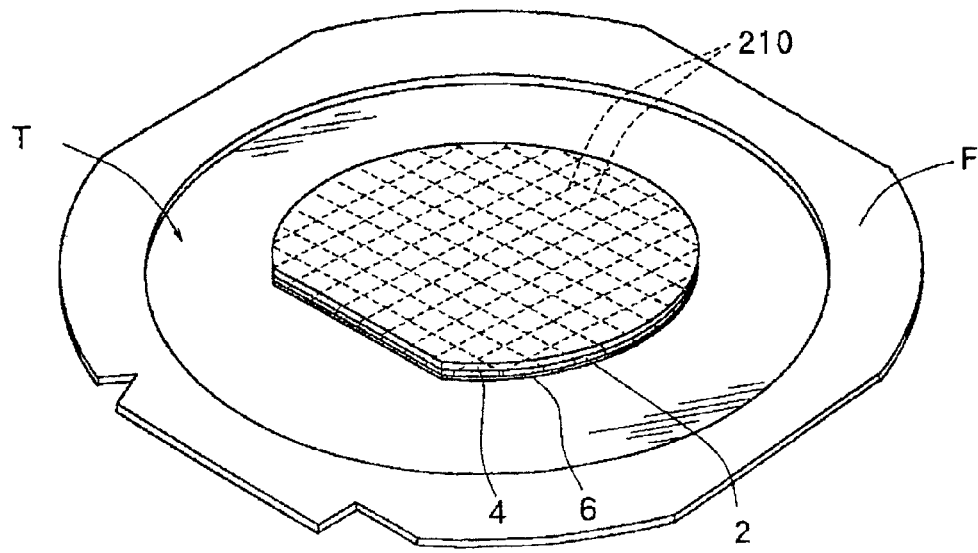

Another embodiment of the above-mentioned adhesive film attaching step and wafer supporting step will now be described, referring to FIGS. 7A and 7B. In the embodiment shown in FIGS. 7A and 7B, a dicing tape with adhesive film which is prepared by preliminarily adhering an adhesive film 6 to a surface of a dicing tape T is used. Specifically, as shown in FIGS. 7A and 7B, the back-side surface 2b of the semiconductor wafer 2 divided into the individual devices 22 is attached to the adhesive film 6 adhered to the surface of the dicing tape T of which an outer peripheral part is attached to the annular frame F so as to cover the inside aperture part of the annular frame F. In this instance, the adhesive film 6 is attached by pressing it against the back-side surface 2b of the semiconductor wafer 2 while heating it at a temperature of 80 to 200° C. Incidentally, the dicing tape T, in the embodiment shown, is formed from a polyolefin sheet having a thickness of 95 μm. Thus, in the case where the dicing tape with adhesive film is used, the back-side surface 2b of the semiconductor wafer 2 is attached to the adhesive film 6 adhered to the surface of the dicing tape T, whereby the semiconductor wafer 2 with the adhesive film 6 attached thereto is supported by the dicing tape T attached to the annular frame F.

After the above-mentioned adhesive film attaching step and wafer supporting step are carried out, an adhesive film fusion-cutting step is carried out in which the adhesive film 6 is irradiated with a laser beam along the cut grooves 210 through the cut grooves 210, the laser beam coming from the side of the protective tape 4 adhered to the face-side surface 2a of the semiconductor wafer 2 adhered to the dicing tape T, whereby the adhesive film 6 is fusion cut along the cut grooves 210. The adhesive film fusion-cutting step is carried out by use of a laser beam machining apparatus 7 shown in FIG. 8. The laser beam machining apparatus 7 shown in FIG. 8 includes a chuck table 71 for holding a work, laser beam irradiation means 72 for irradiating the work held on the chuck table 71 with a laser beam, and image pickup means 73 for picking up an image of the work held on the chuck table 71. The chuck table 71 is so configured as to hold a work by suction and as to be moved in a machining feed direction of arrow X and an indexing feed direction of arrow Y, in FIG. 8, by a moving mechanism (not shown).

The laser beam irradiation means 72 radiates a pulsed laser beam from a condenser 722 attached to the tip of a cylindrical casing 721 disposed substantially horizontally. In addition, the image pickup means 73 attached to a tip part of the casing 721 constituting the laser beam irradiation means 72, in the embodiment shown, includes not only an ordinary image pickup element (CCD) for picking up an image through use of visible rays but also infrared irradiation means for irradiating the work with infrared rays, an optical system for catching the infrared rays radiated by the infrared irradiation means, an image pickup element (infrared CCD) for outputting an electrical signal corresponding to the infrared rays caught by the optical system, and a picture signal corresponding to the image picked up is sent from the image pickup means 73 to control means (not shown).

Figure 8:
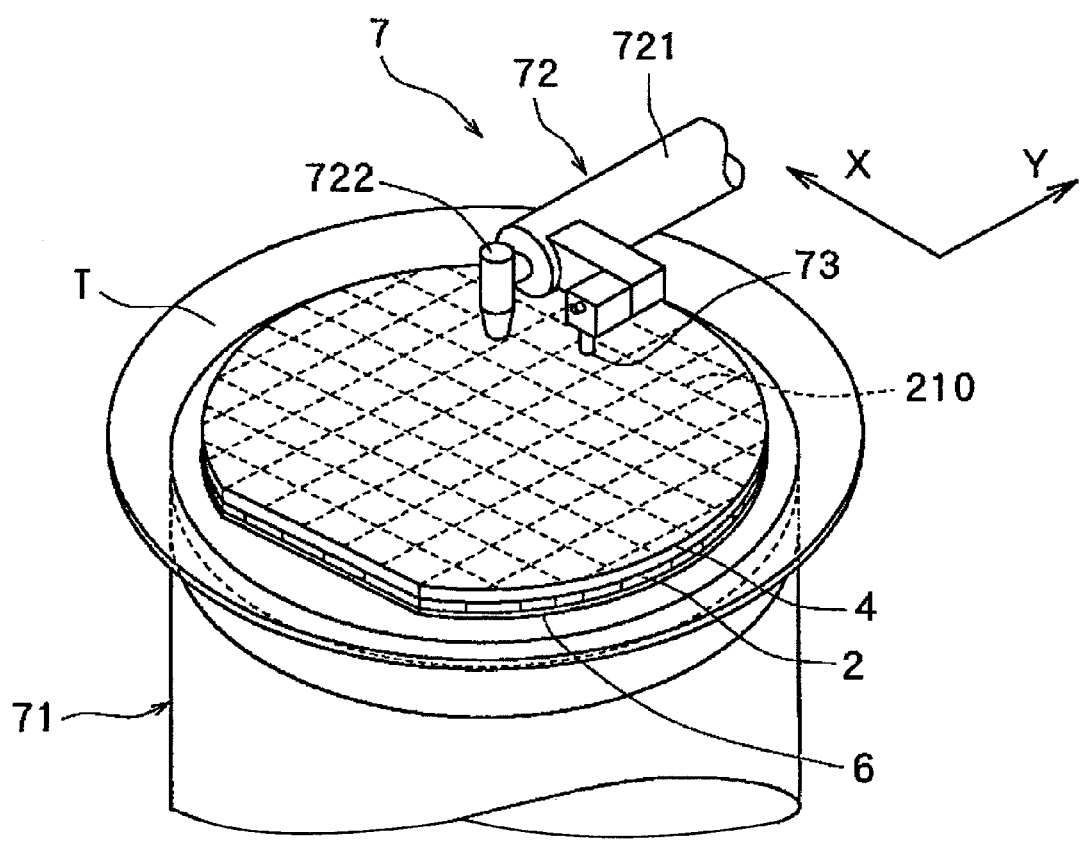
FIG. 8 is a perspective view of a laser beam machining apparatus for carrying out the adhesive film fusion-cutting step in the device manufacturing method based on the present invention.

The adhesive film fusion-cutting step carried out by use of the laser beam machining apparatus 7 as above will now be described, referring to FIGS. 8 to 10. In the adhesive film fusion-cutting step, first, as shown in FIG. 8, the dicing tape T to which the adhesive film 6 side of the semiconductor wafer 2 is adhered is mounted on the chuck table 71, and suction held there. Therefore, the protective film 4 adhered to the face-side surface 2a of the semiconductor wafer 2 is on the upper side. Incidentally, while the annular frame F to which the dicing tape T is attached is omitted in FIG. 8, the annular frame F is fixed by appropriate clamps with which the chuck table 71 is equipped.

The chuck table 71 with the semiconductor wafer 2 suction held thereon as above-mentioned is positioned into a position just under the image pickup means 73 by the moving mechanism (not shown). After the chuck table 71 is positioned just under the image pickup means 73, an alignment work is carried out in which the machining region, to be laser beam machined, of the adhesive film 6 attached to the back-side surface 2b of the semiconductor wafer 2 is detected by the image pickup means 73 and the control means (not shown). Specifically, the image pickup means 73 and the control means execute an image processing such as pattern matching for positional matching between the cut groove 210 formed in the semiconductor wafer 2 along a predetermined direction and the condenser 722 of the laser beam irradiation means 72 for irradiation with a laser beam along the cut groove 210, so as to perform alignment of a laser beam irradiation position. In addition, alignment of the laser beam irradiation position is carried out in the same manner also with respect to the cut groove 210 formed in the semiconductor wafer 2 along a direction perpendicular to the predetermined direction. In this instance, in the case where the protective tape 4 adhered to the face-side surface 2a of the semiconductor wafer 2 divided into the individual devices 22 is non-transparent and the cut grooves 210 cannot therefore be confirmed, image pickup means composed of infrared irradiation means, an optical system for catching the infrared rays, and an image pickup element (infrared CCD) for outputting an electrical signal corresponding to the infrared rays, and the like is used as the image pickup means 73, whereby an image of the cut grooves 210 can be picked up through the protective tape 4.

Figure 9:
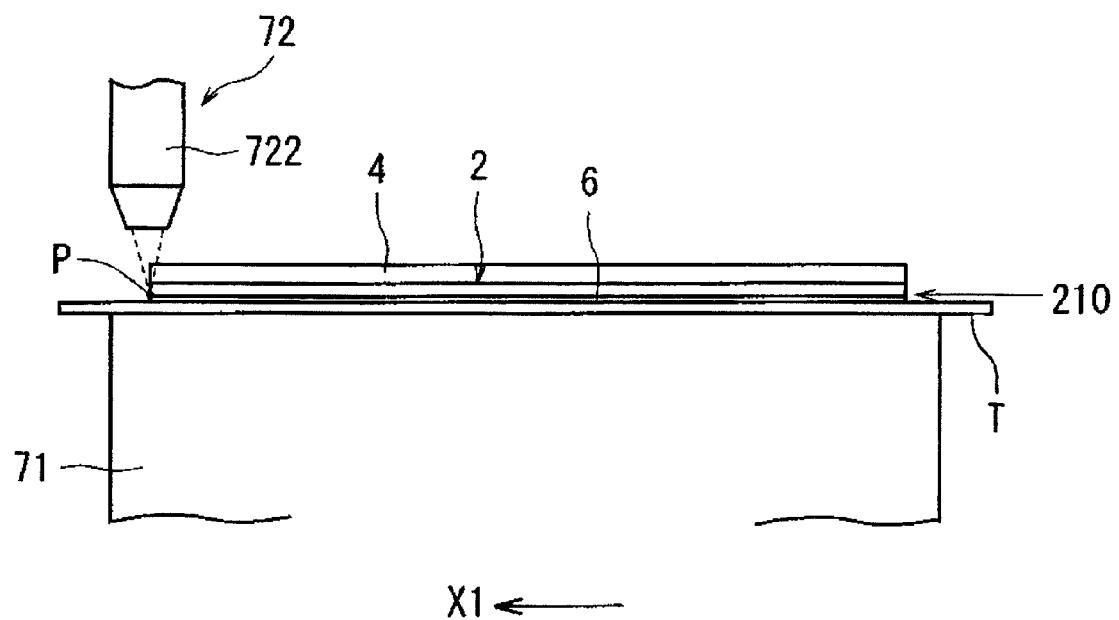
FIG. 9 illustrates an adhesive film fusion-cutting step in the device manufacturing method based on the present invention.
Figure 10:
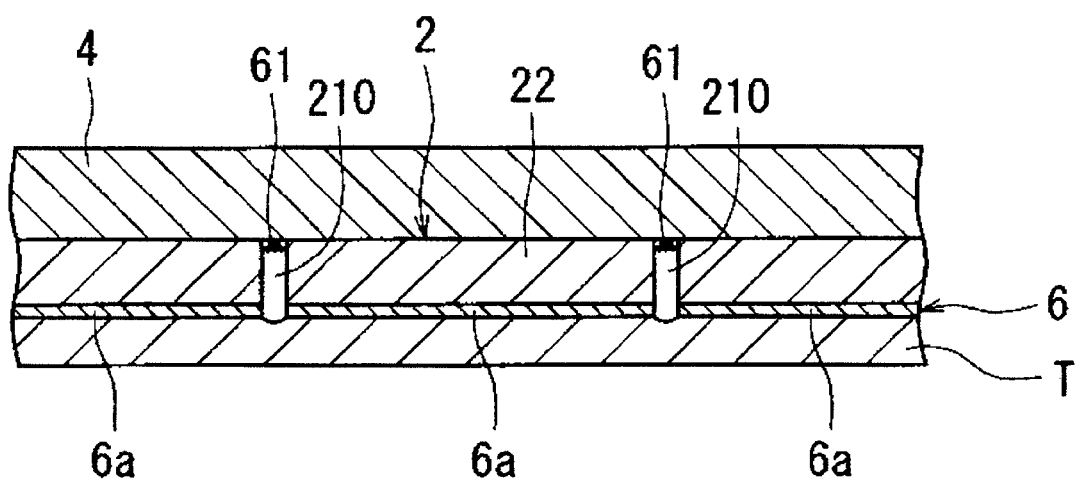
FIG. 10 is an essential part enlarged sectional view showing the condition where the device manufacturing method illustrated in FIG. 9 has been carried out.

After the alignment of the laser beam irradiation position is conducted as above, the chuck table 71 is moved into the laser beam irradiation region where the condenser 722 of the laser beam irradiation means 72 for irradiation with a laser beam is positioned, and one end (the left end in FIG. 9) of a predetermined cut groove 210 is positioned into a position just under the condenser 722 of the laser beam irradiation means 72, as shown in FIG. 9. While a laser beam having such a wavelength that the laser beam is not absorbed by the protective tape 4 but that the laser beam is absorbed by the adhesive film 6 is being radiated from the condenser 722, the chuck table 71 is moved at a predetermined feed rate in the direction of arrow X1 in FIG. 9, and, when the other end (the right end in FIG. 9) of the cut groove 210 has reached the irradiation position of the condenser 722, irradiation with the pulsed laser beam is stopped, and the movement of the chuck table 71 is stopped. In this instance, irradiation with the pulsed laser beam radiated from the condenser 722 of the laser beam irradiation means 72 is conducted while a converging point P (the point where a converging spot is formed) is adjusted to the upper surface of the adhesive film 6 through the cut groove 210.

Incidentally, the wavelength of the laser beam is set at 355 nm, which ensures that the laser beam is not absorbed by the polyolefin sheet constituting the protective tape 4 but that the laser beam is absorbed by the film material obtained by mixing an epoxy resin and an acrylic resin and constituting the adhesive film 6. However, the wavelength is set as required, based on the relation between a blank material selected as the protective tape and a blank material selected as the adhesive film. As a result, the adhesive film 6 is fusion cut along the cut groove 210 by the energy of the laser beam transmitted through the protective tape 4, as shown in FIG. 10. At the time when the adhesive film 6 is fusion cut in this manner, debris 61 is scattered. However, the debris 61 is deposited on the protective tape 4 adhered to the back-side surface 2a of the semiconductor wafer 2, so that the debris 61 would not be deposited on the devices formed at the face-side surface 2a of the semiconductor wafer 2. Incidentally, at the time of carrying out the adhesive film fusion-cutting step, the protective tape 4 is left adhered to the face-side surface 2a of the semiconductor wafer 2, so that the individually divided devices 22 would not be moved. Therefore, the gaps composed of the cut grooves 210 formed along the streets 21 would not come to meander, and, accordingly, irradiation with the laser beam can be performed through the gaps between the devices 22.

Incidentally, the machining conditions in the adhesive film fusion-cutting step may be set, for example, as follows.

Light source: LD-started Q switch Nd:YVO4 laser
Wavelength: 355 nm
Mean output: 3 W
Pulse width: 10 nm
Repetition frequency: 50 kHz
Converging spot diameter: φ5 μm
Machining feed rate: 100 mm/sec After the adhesive film 6 is fusion cut along the cut groove 210 in the predetermined direction, the chuck table 71 is subjected to indexing feeding in the direction of arrow Y (see FIG. 8) by the interval of the cut grooves 210, and the above-mentioned adhesive film fusion-cutting step is conducted. After the adhesive film fusion-cutting step and the indexing feeding are carried out for all the cut grooves 210 formed in the predetermined direction, the chuck table 71 is turned by 90 degrees, and the adhesive film fusion-cutting step and the indexing feeding are carried out along the cut grooves 210 formed in the direction perpendicular to the predetermined direction. By this, as shown in FIG. 10, the adhesive film 6 is fusion cut into adhesive films 6a attached respectively to the individual devices 22 obtained by dividing the semiconductor wafer 2 by the cut grooves 210.

Figure 11:
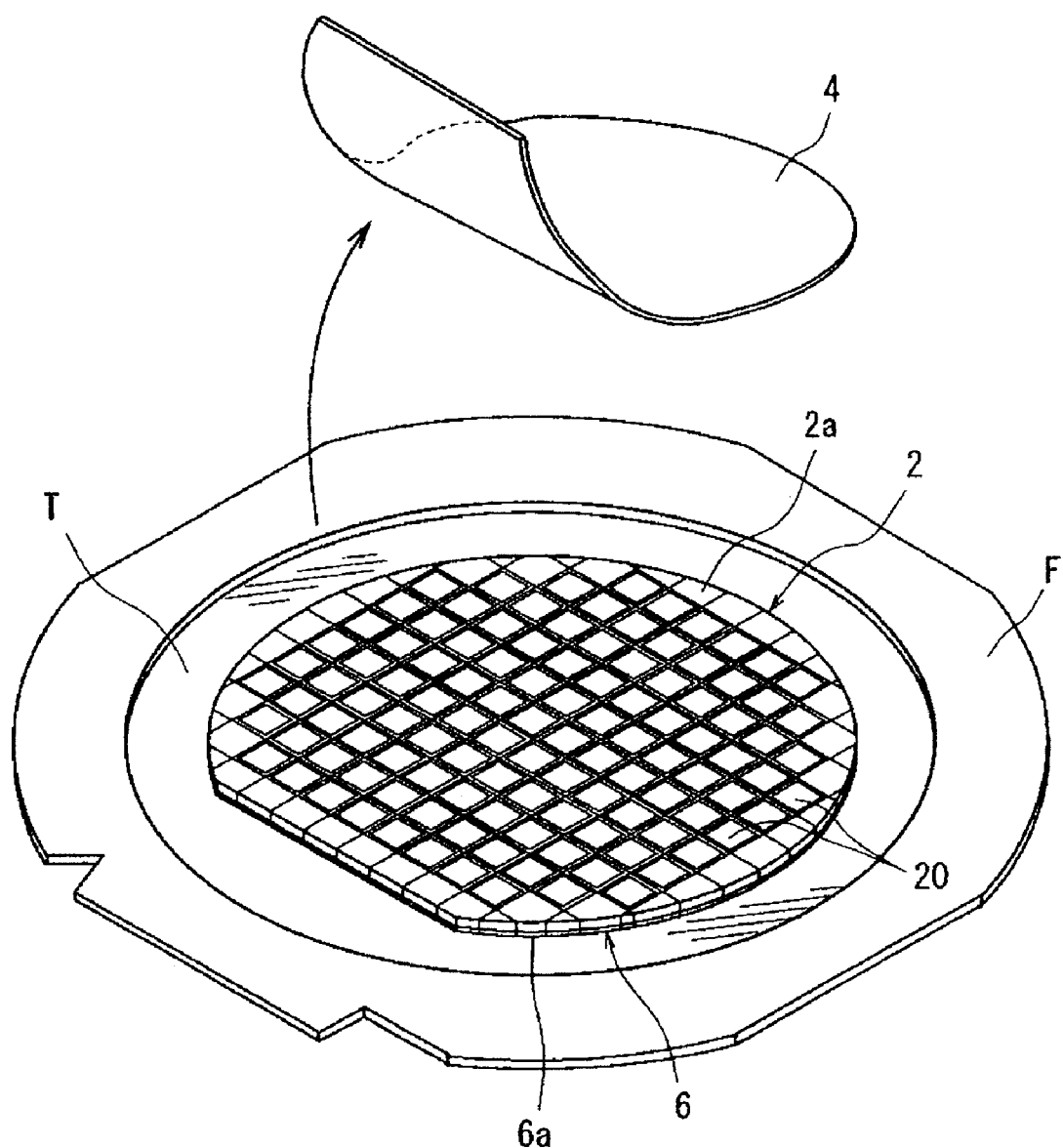
FIG. 11 illustrates a protective tape peeling step in the device manufacturing method based on the present invention.

After the adhesive film fusion-cutting step is carried out as above-mentioned, a protective tape peeling step is conducted to peel the protective tap 4 adhered to the face-side surface 2a of the semiconductor wafer 2. Specifically, as shown in FIG. 11, the protective tape 4 adhered to the face-side surface 2a of the semiconductor wafer 2 adhered to the surface of the dicing tape T attached to the annular frame F is peeled off.

Figure 12:
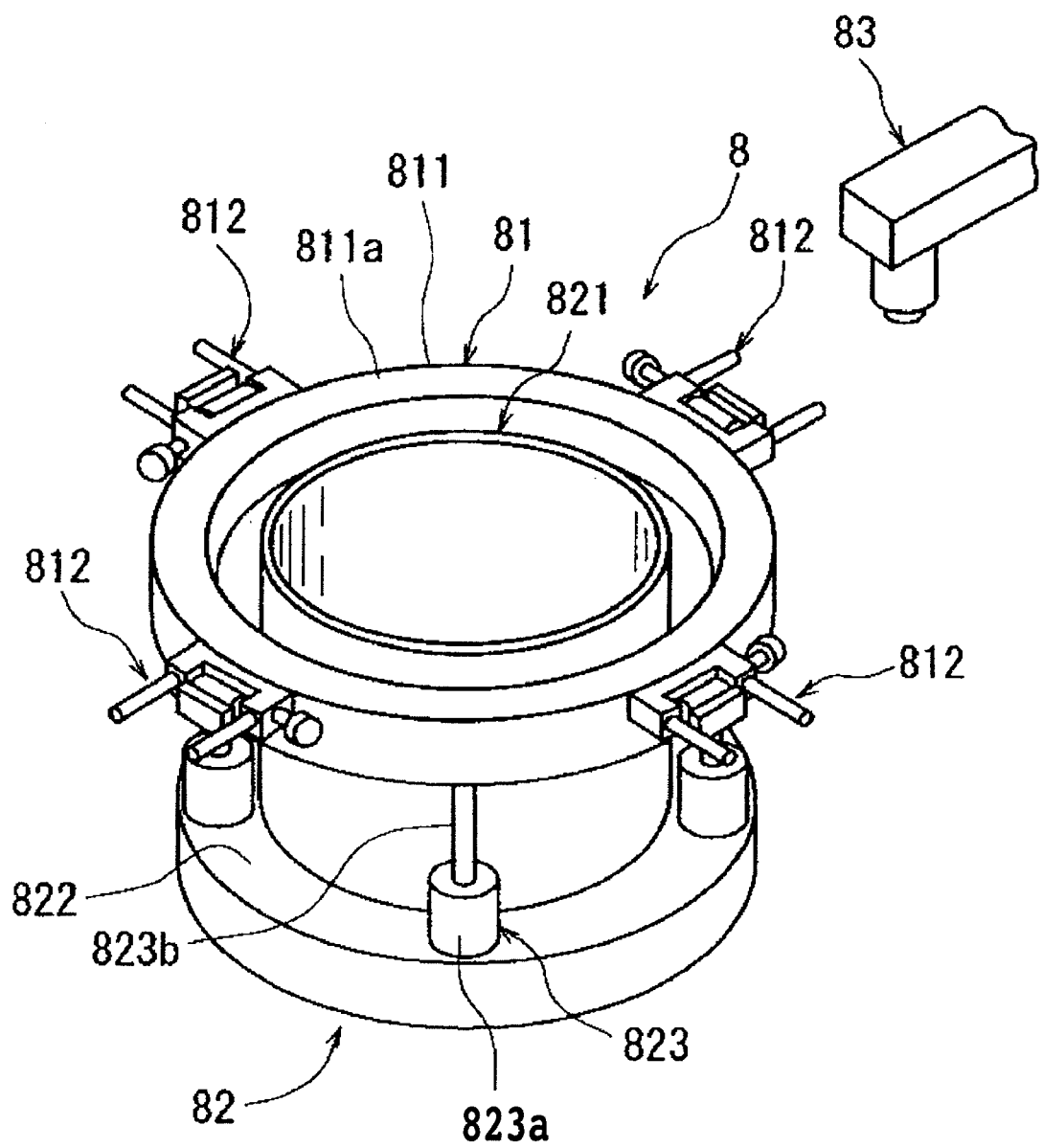
FIG. 12 is a perspective view of a picking-up apparatus for carrying out the picking-up step in the device manufacturing method based on the present invention.

Next, a picking-up step is carried out in which the devices 22 to which the adhesive films 6a fusion cut along the cut grooves 210 by conducting the above-mentioned adhesive film fusion-cutting step are attached are peeled from the dicing tape F, and picked up. The picking-up step is carried out by use of a picking-up apparatus 8 shown in FIG. 12. The picking-up apparatus 8 shown in FIG. 12 includes frame holding means 81 for holding the annular frame F, tape expanding means 82 for expanding the dicing tape T attached to the annular frame F held by the frame holding means 81, and a picking-up collet 83. The frame holding means 81 has an annular frame holding member 811, and a plurality of clamps 812 as fixing means arranged at the outer periphery of the frame holding member 811. An upper surface of the frame holding member 811 constitutes a mount surface 811a on which to mount the annular frame F, and the annular frame F is mounted on the mount surface 811a. The annular frame F mounted on the mount surface 811a is fixed to the frame holding member 811 by the clamps 812. The frame holding means 81 thus configured is supported by the tape expanding means 82 so that it can be advanced and withdrawn in the vertical direction.

Figure 13A:
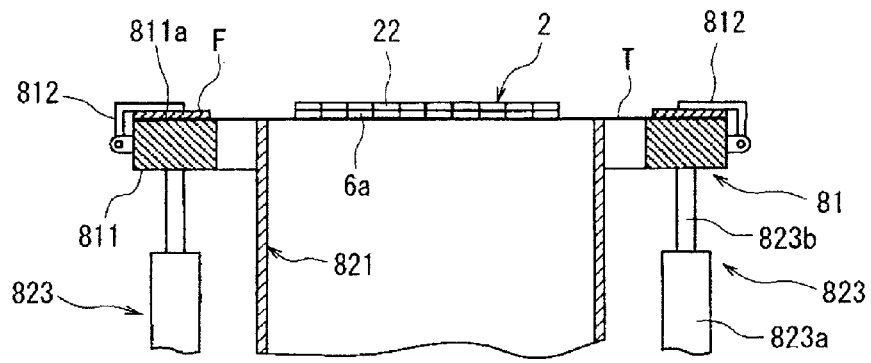
FIGS. 13A to 13C illustrate the picking-up step in the device manufacturing method based on the present invention.
Figure 13B:
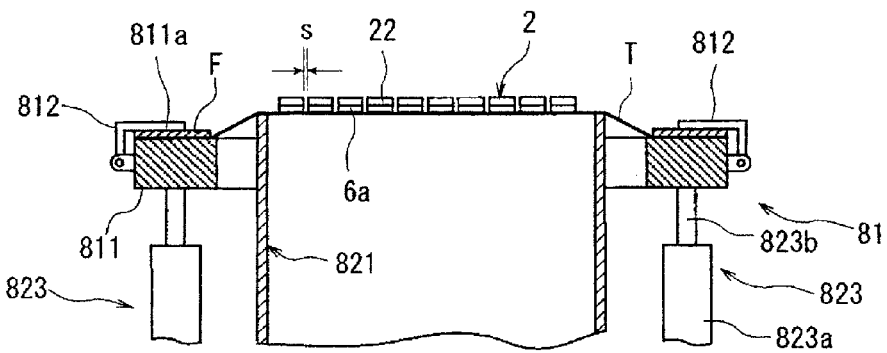

The tape expanding means 82 has an expansion drum 821 disposed on the inside of the annular frame holding member 811. The expansion drum 821 has an inner diameter and an outer diameter which are smaller than the inner diameter of the annular frame F and greater than the outer diameter of the semiconductor wafer 2 adhered to the dicing tape T attached to the annular frame F. The expansion drum 821 is provided with a support flange 822 at the lower end thereof. The tape expanding means 82 in the embodiment shown has support means 823 by which the annular frame holding member 811 can be advanced and withdrawn in the vertical direction. The support means 823 includes a plurality of air cylinders 823a arranged on the support flange 822, and piston rods 823b in the air cylinders 823a are connected to the lower surface of the annular frame holding member 811. The support means 823 thus including the plurality of air cylinders 823a moves the annular frame holding member 811 in the vertical direction between a reference position where the mount surface 811a is at substantially the same level as the upper end of the expansion drum 821 as shown in FIG. 13A and an expansion position where the mount surface 811a is deviated by a predetermined amount downwards from the upper end of the expansion drum 821 as shown in FIG. 13B.

Figure 13C:
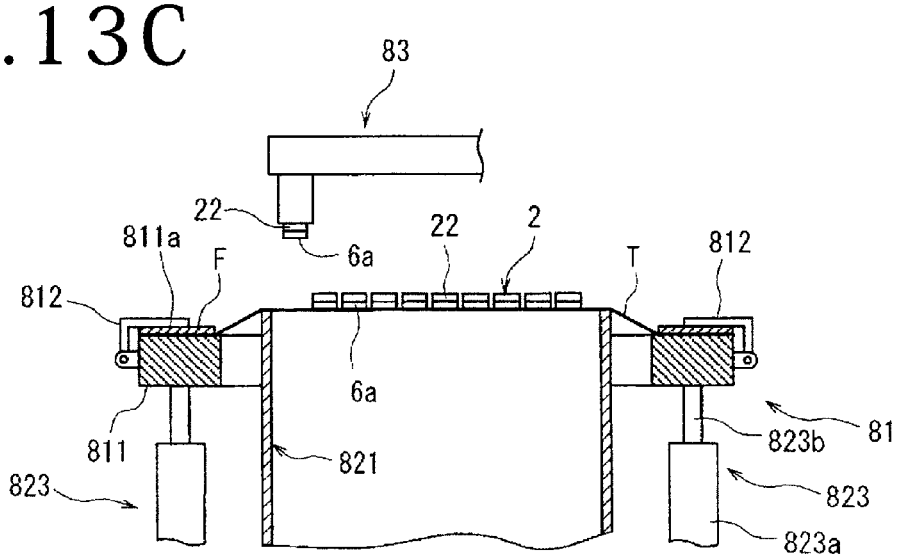

The picking-up step conducted by use of the tape expansion apparatus 70 configured as above-mentioned will now be described, referring to FIGS. 13A to 13C. As shown in FIG. 13A, the annular frame F to which the dicing tape T with the semiconductor wafer 2 (divided along the streets 21 into the individual devices 22) adhered thereto is attached is mounted on the mount surface 811a of the frame holding member 811 constituting the frame holding means 81, and is fixed to the frame holding member 811 by the clamps 812. In this instance, the frame holding member 811 is positioned in the reference position shown in FIG. 13A. Next, the plurality of air cylinders 823a as the support means 823 constituting the tape expanding means 82 are operated, so as to lower the annular frame holding member 811 to the expansion position shown in FIG. 13B. Therefore, the annular frame F fixed onto the mount surface 811a of the frame holding member 811 is also lowered, so that the dicing tape T attached to the annular frame F is expanded while keeping contact with the upper end edge of the expansion drum 821.

As a result, the spacings between the adhesive films 6 adhered to the dicing tape T and between the devices 22 with the adhesive films 6 adhered thereto are widened, i.e., the gaps S are enlarged. Next, as shown in FIG. 13C, the picking-up collet 83 is operated to suction hold the device 22 (with the adhesive film 6a attached to the back-side surface thereof), to peel the device 22 from the dicing tape T, thereby to pick up the device 22, and to transport onto a tray (not shown) or to a die bonding step (not shown). Incidentally, in carrying out the picking-up step, the dicing tape T is irradiated with UV rays to lower its tackiness. In the picking-up step as above, the gaps S between the individual devices 22 with the adhesive film 6 adhered thereto are widened as above-mentioned, so that the device 22 can be easily picked up without making contact with the adjacent device(s) 22.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a semiconductor device, for manufacturing a plurality of semiconductor devices from a semiconductor wafer having devices formed respectively in a plurality of regions demarcated by a plurality of streets formed in a grid pattern in a face-side surface of said semiconductor wafer, said method comprising:

a cut groove forming step of forming cut grooves having a depth corresponding to a finished thickness of said devices, from the face side of said wafer and along said streets;

a protective tape adhering step of adhering a protective tape to said face-side surface of said wafer provided with said cut grooves;

a wafer dividing step of grinding a back-side surface of said wafer with said protective tape adhered thereto so as to expose said cut grooves on the back side and dividing said wafer into individual devices;

an adhesive film attaching step of adhering an adhesive film to said back-side surface of said wafer divided into said individual devices, and supporting said wafer with said adhesive film attached thereto by a dicing tape attached to an annular frame;

an adhesive film fusion-cutting step of irradiating said adhesive film with a laser beam along said cut grooves through said cut grooves from the side of said protective tape adhered to said face-side surface of said wafer supported by said dicing tape, and fusion-cutting said adhesive film along said cut grooves;

a protective tape peeling step of peeling off said protective tape adhered to said face-side surface of said wafer after performing said adhesive film fusion-cutting step; and a picking-up step of peeling from said dicing tape said devices to which said adhesive film fusion cut along said cut grooves by performing said adhesive film fusion-cutting step is attached, and picking up said devices.

* * * * *